United States Patent [19]

Maehara

[11] Patent Number: 5,255,236
[45] Date of Patent: Oct. 19, 1993

[54] ROM CARD UNIT

[75] Inventor: Mitsuo Maehara, Nagoya, Japan

[73] Assignee: Mitsubishi Denki Kabushiki Kaisha, Tokyo, Japan

[21] Appl. No.: 681,342

[22] Filed: Apr. 8, 1991

[30] Foreign Application Priority Data

Apr. 9, 1990 [JP] Japan .................................... 2-93546

[51] Int. Cl.⁵ ........................ G11C 7/00; G11C 13/04
[52] U.S. Cl. ...................................... 365/218; 365/215
[58] Field of Search ............... 365/122, 127, 215, 218, 365/234

[56] References Cited

U.S. PATENT DOCUMENTS 5,036,488  7/1991  Motarjemi ...................... 365/218 X

FOREIGN PATENT DOCUMENTS 3700109  7/1988  Fed. Rep. of Germany .
8808814  7/1988  Fed. Rep. of Germany .

OTHER PUBLICATIONS

IBM Technical Disclosure Bulletin, vol. 27, No. 212, May 1985 p. 6937.
G. J. Turner, *Ultraviolet Light "Eprom" Eraser*, Technical Digest, No. 62, Apr. 1981, p. 21.

*Primary Examiner*—Steven Mottola
*Attorney, Agent, or Firm*—Rothwell, Figg, Ernst & Kurz

[57] ABSTRACT

A ROM card unit having a card package accommodating a ROM card board on which ROMs allowing data stored therein to be erased by ultraviolet radiation are mounted. A transparent cover permitting ultraviolet light to transmit therethrough is provided on a first side of the card package where there are ultraviolet radiation windows of the ROMs. An ultraviolet shield member for preventing unwanted erasure of the data in the ROMs is mounted on the first side of the card package in such a manner as to be removable therefrom.

4 Claims, 4 Drawing Sheets

ROM CARD UNIT

BACKGROUND OF THE INVENTION

1. Field of the Invention

The present invention relates to an improvement in a ROM card unit having a card package accommodating a ROM card on which ROMs whose contents are earsable by ultraviolet radiation are mounted.

2. Description of the Related Art

In general, read-only memories (ROMS) include the following: a mask ROM whose contents are wirtten by the IC manufacturer as previously specified by the user; a fuse ROM which allows data to be freely written by the user, but does not allow the data to be altered; an erasable programmable read-only memory (EPROM) which allows data to be freely written by the user, and allows its contents to be erased by ultraviolet radiation; and electrically erasable programmable read-only memory (EEPROM) which allows data to be freely written by the user, and allows its contents to be erased by an electrical operation. From the view point of reliability and response speed, EPROMs which allow their contents to be erased by ultraviolet radiation are often used. Therefore, in describing the present invention, a ROM card unit which accommodate EPROMs of the ultraviolet-erasable type (hereinafter simply referred to as "ROMs") will be explained. With such a ROM, data is written by electrically exciting flip-flops corresponding to the bits constituting the data (hence, the contents stored). The data written in this way is erased by radiating ultraviolet light onto the flip-flops of the ROM for a certain period of time, whereby the irradiated flip-flops are, through the supply of energy, brought to their initial state. In order to prevent unwanted natural erasure of written data, a mask seal for preventing transmission of ultraviolet light is adhered to a ROM over an ultraviolet radiation window of the ROM.

FIGS. 6 and 7 show, in front and side views, a conventional ROM card unit. FIG. 8 is a front view of the ROM card of the ROM card unit, and FIG. 9 is an exploded perspective view of the ROM card unit. As shown in these figures, the conventional ROM card unit includes a ROM card board 1, ROMs 2 mounted on the ROM card board 1, ROM mask seals 3 for preventing unwanted erasure of the contents of the ROMs 2, and a connector 4 electrically connected with a pattern (not shown) formed on the ROM card substrate 1. The above-described members 1 to 4 constitute a ROM card. The conventional ROM card unit also includes a card package comprising a card package body 5 for accommodating the ROM card, and a card package cover 6 which is attached to the card package body 5.

With this conventional structure, data stored in ROMs of the ROM card is rewritten by the following process.

When the data stored in the ROMs 2 is to be rewritten, screws 7 joining the card package body 5 and the card package cover 6 together are removed, and the ROM card board 1, with the ROMS, is taken out from the inside of the card package body 5. All the ROM mask seals 3, adhered to the ROMs 2 over ultraviolt radiation windows 2a thereof, are removed to effect the erasure of the contents of the ROMs 2 by ultraviolet radiation. Thereafter, the whole card is subjected to the operation of writing new data into the ROMs 2.

With the above-described construction of the conventional ROM card unit, when, for instance, the data in the ROMs 2 is to be rewritten, it is necessary to remove the card package cover 6, to take out the ROM card board 1, with various members thereon, and to remove the ROM mask seals 3. In addition, there is a risk that the adhesion of the ROM mask seals 3 may deteriorate, thereby making the seals 3 unable to be repeatedly applied.

SUMMARY OF THE INVENTION

Accordingly, an object of the present invention is to provide a ROM card unit which does not require the use of ROM mask seals, and which allows the data in the ROMs to be erased and rewritten while the ROM card board supporting the ROMs remains within the card package.

A ROM card unit according to the present invention includes: a transparent cover which permits ultraviolet light to transmit therethrough and which is disposed on that side of the card package body where there are the ultraviolet radiation windows of ROMS; and an ultraviolet shield member for preventing unwanted erasure of the data in the ROMS, the member being removably mounted in the card package.

The ultraviolet shield member of the ROM card unit according to the present invention is removed from the card package body when the data in the ROMs is to be erased. When the ROM card unit is to be used as a control memory, the ultraviolet shield member is mounted in the card package in order to prevent unwanted erasure of the data in the ROMS.

DESCRIPTION OF THE PREFERRED EMBODIMENTS

Figure 1:
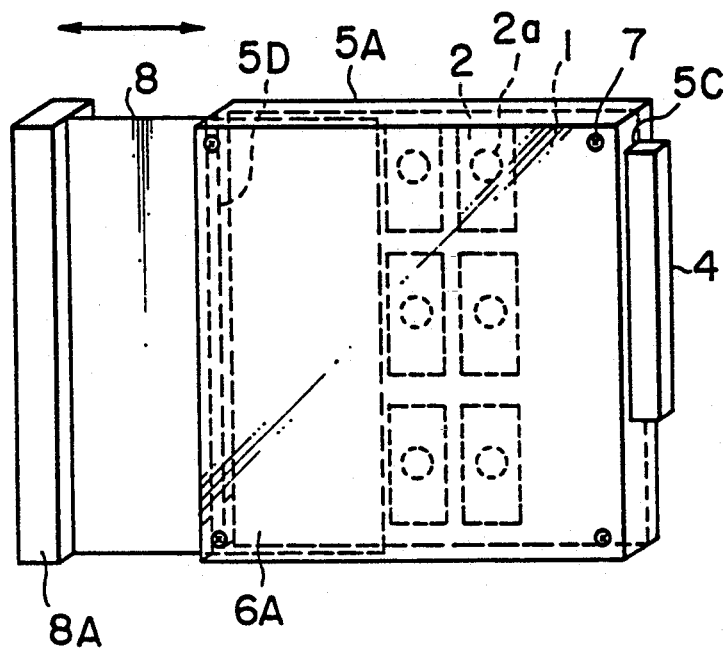
FIG. 1 is a perspective view of a ROM card unit according to one embodiment of the present invention, the ROM card unit being shown with its ultraviolet shield member being partially drawn out.
Figure 2:
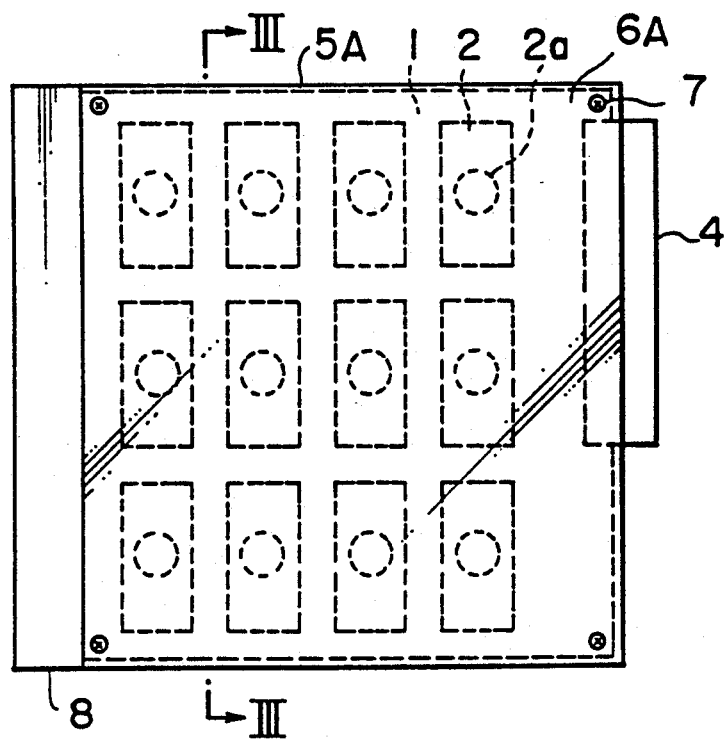
FIG. 2 is a front view of the ROM card unit shown in FIG. 1.
Figure 3:
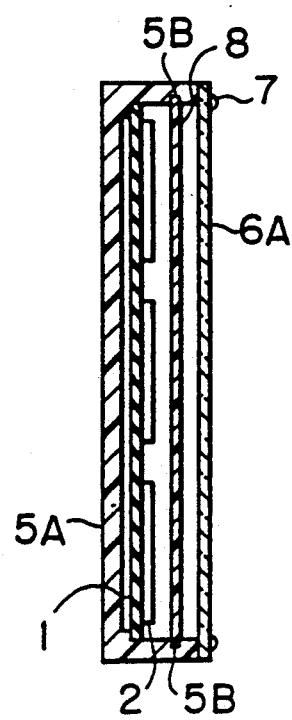
FIG. 3 is a sectional view taken along the line III—III shown in FIG. 2.
Figure 4:
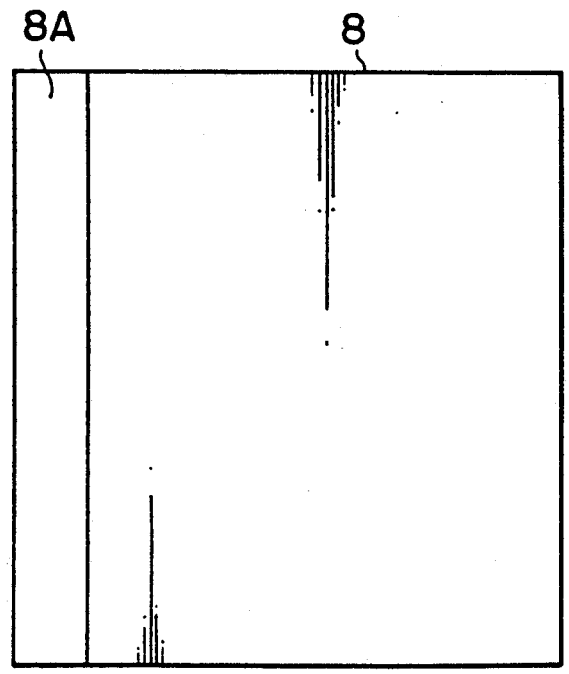
FIG. 4 is a front view of the ultraviolet shield member of the ROM card unit shown in FIG. 1.
Figure 5:
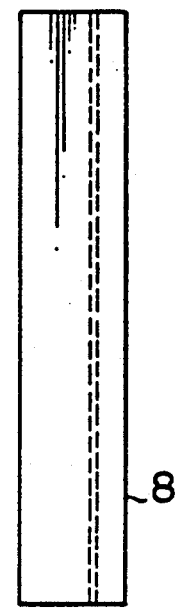
FIG. 5 is a side view of the ultraviolet shield member shown in FIG. 4.
Figure 6:
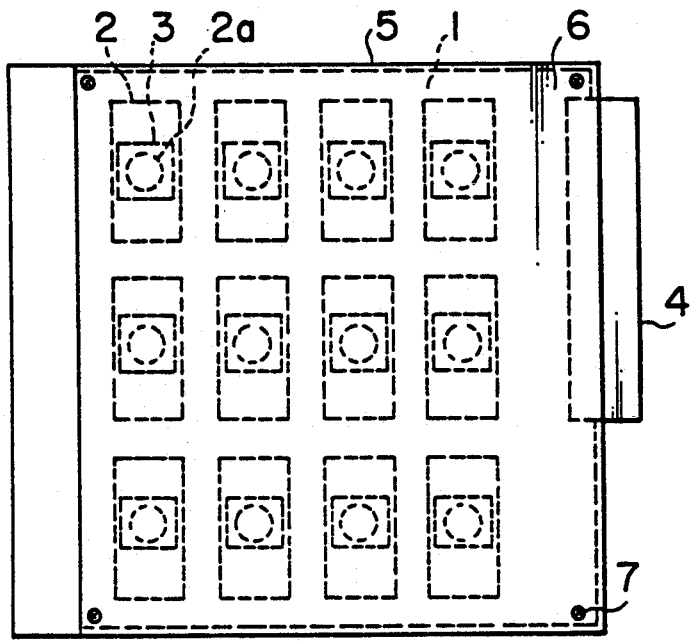
FIG. 6 is a front view of a conventional ROM card unit.
Figure 7:
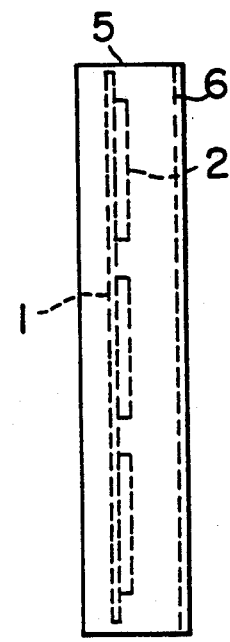
FIG. 7 is a side view of the conventional ROM card unit shown in FIG. 6.
Figure 8:
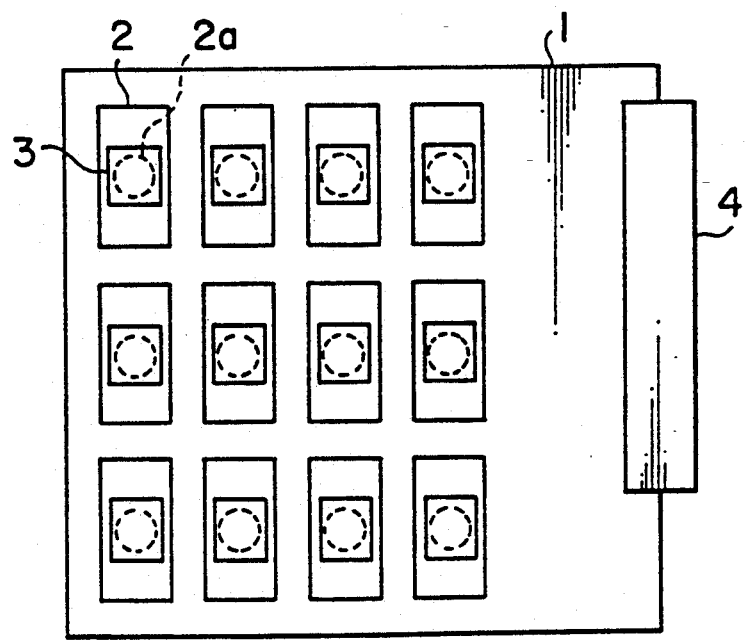
FIG. 8 is a front view of the board of the conventional ROM card unit.
Figure 9:
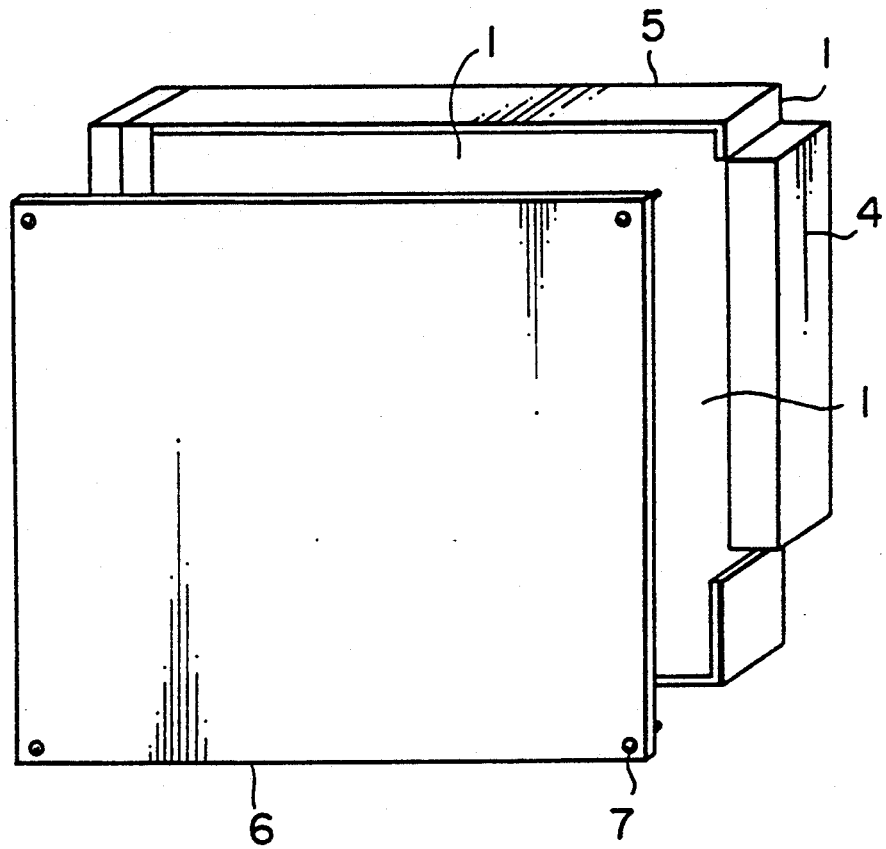
FIG. 9 is an exploded perspective view of the conventional ROM card unit.

An embodiment of the present invention will now be described with reference to the following drawings: FIG. 1 showing, in a perspective view, a ROM card unit according to an embodiment of present invention; FIG. 2 showing, in a front view, the ROM card unit; FIG. 3 showing a section of the ROM card unit through the line III—III shown in FIG. 2; and FIGS. 4 and 5, showing, in front and side views, respectively, an ultraviolet shield member of the ROM card unit (which member is also shown in FIG. 1 in its position of partially drawn out).

Referring to these figures, the ROM card unit includes a ROM card board 1, and a plurality of ROMs 2 mounted on the ROM card board 1. The ROMs 2 have ultraviolet radiation windows 2a on the respective first sides thereof. However, in contrast with the conventional ROM card unit, no mask seals are provided over the windows 2a. The ROM card board 1 and the ROMs 2 constitute, together with a connector 4 (described later), a ROM card.

A box-shaped card package body 5A (having U-shaped section, as shown in FIG. 3) accommodates the ROM card board 1 with the ROMs 2 mounted thereon, in such a manner that those sides of the ROMs 2 having the ultraviolet radiation portions of the ROMs 2, i.e., the ultraviolet radiation windows 2a, are opened. The card package body 5A is formed of a material which does not permit the transmission therethrough of ultraviolet light, such as a deep black plastic material. The card package body 5A has an opening 5C formed on a lateral side surface thereof, and a slit 5D formed on the other lateral side surface thereof. The connector 4 is provided on the ROM card board 1, and a part of the connector 4 projects to the outside of the card package body 5A through the opening 5C. An ultraviolet shield member 8, described in detail below, is mounted on and removed from the card package body 5A by inserting the ultraviolet shield member 8 into and drawing it out of the interior of the card package body 5A through the slit 5D in the directions indicated by the arrow in FIG. 1. As shown in FIG. 3, grooves 5B for guiding the ultraviolet shield member 8 are formed on the inner walls of a pair of side surfaces (upper and lower side surfaces) of the card package body 5A which are different from the side surfaces on which the opening 5C and the slit 5D are formed.

A cover 6A closes the opening of the card package body 5A, and thus constitutes, together with the card package body 5A, a card package. The cover 6A is formed of a material permitting the transmission therethrough of ultraviolet light, such as a transparent plastic material. The cover 6A is fixed to the card package body 5A by screws 7. The ultraviolet shield member 8 is composed of, for example, a member formed of a deep black plastic material or a plastic member entirely covered with a material conventionally used to form ROM mask seals, and is capable of cutting off ultraviolet light from the outside of the package body 5A. The ultraviolet shield member 8 is removably mounted in the card package, more specifically, removably mounted on the card package body 5A in such a manner that the ultraviolet shield member 8 can be freely mounted on and removed from the card package body 5A while being guided by the grooves 5B. As shown in FIGS. 4 and 5, the ultraviolet shield member 8 has a handle 8A for mounting and removing the member 8. The handle 8A also serves, when the ultraviolet shield member 8 is mounted on the card package body 5A, to close the slit 5D on the lateral side surface of the card package body 5A so that no ultraviolet light enters the inside of the card package body 5A. The ROM card unit according to this embodiment has the above-described construction.

The ROM card unit is used in the following manner.

When data stored in the ROMs 2 is to be rewritten, while the card package body 5A and the transparent cover 6A remain joined together the ultraviolet shield member 8 for masking the ROMs 2 is drawn out of the package body 5A, whereby, while the ROM card board 1 and the ROMs 2 remain within the card package, the contents of the ROMs 2 are erased by ultraviolet transmitted through the transparent cover 6A. When new data is to be written into the ROMs 2, a writing operation is performed while the ROM card board 1 and the ROMs 2 remain in the card package. After the writing operation, the ultraviolet shield member 8 is inserted into the card package so as to prevent unwanted erasure of the data stored in the ROMs 2.

In the above-described embodiment, the ultraviolet shield member 8 is disposed in the space between the card board 1 and the transparent cover 6A to prevent unwanted erasure of data stored in the ROMs 2. However, another arrangement may be adopted, in which the transparent cover 6A for the card package body 5A is omitted, and in which the ultraviolet shield member 8 also functions as a cover 6A for the card package body 5A.

Figure 3A:
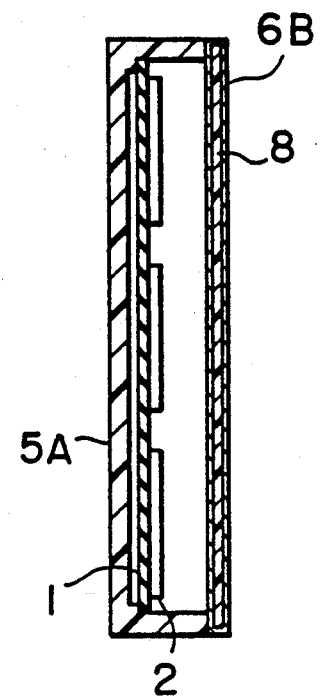
FIG. 3A is a sectional view of a ROM card unit according to another embodiment of the present invention.

Similar effects can be provided by an arrangement in which a cover 6A of the card package comprises a pass-case-shaped cover having two transparent cover plates, and in which the ultraviolet shield member 8 is disposed in the space between these cover plates. Specifically, as shown in FIG. 3A, a pass-case-shaped cover 6B having two transparent cover plates is fixed to the open side of the card package body 5A, and the shield member 8 is removably inserted into the space between the two cover plates.

As described above, according to the present invention, remarkable effects, such as the following, are provided. During manufacture, since mask seals need not be adhered to the individual ROMS, it is possible to omit the operation of adhering the seals. Further, since there is no need to prepare particular mask seals for the individual ROMS, the production cost can be lowered. During use, since the operation of removing the ROM card from the card package is omitted, the efficiency of such an operation as data rewriting can be improved. In addition, since the ROM card itself is not removed, it can be free from IC destruction caused by static electricity from the human body, thereby making it possible to improve the product quality.

What is claimed is:

1. A ROM card unit comprising:

a ROM card board on which a plurality of ROMs allowing data stored therein to be erased by ultraviolet light radiation are mounted, said ROMs having ultraviolet radiation windows;

a card package body accommodating said ROM card board with said ROMs so as to expose those sides of said ROMs where said ultraviolet radiation windows are located, said card package body being formed of a material capable of cutting off ultraviolet light; and ultraviolet transmission means mounted on that side of said card package body where there are said ultraviolet radiation windows of said ROMs, said ultraviolet transmission means normally cutting off ultraviolet light from the outside of said package body, whereas allowing the transmission of ultraviolet light when data stored in said ROMs is to be erased so that ultraviolet light is radiated from the outside of said package body through said ultraviolet radiation windows of said ROMs wherein said ultraviolet transmission means comprises a transparent cover formed of a material permitting the transmission therethrough of ultraviolet light and fixed to that side of said card package body where there are said ultraviolet radiation windows of said ROMs, and an ultraviolet shield member formed of a material capable of cutting off ultraviolet light and mounted on the same side of said card package body as said transparent cover in such a manner as to be removable from said card package body.

2. A ROM card unit as claimed in claim 1 wherein said transparent cover is fixed to said card package body from the outside thereof, and said ultraviolet shield member is removably mounted in the space between said transparent cover and said ROM card board said card package body having grooves formed on inner walls thereof for guiding said ultraviolet shield member.

3. A ROM card unit as claimed in claim 2 wherein a ROM card comprises said ROM card board said ROMs and a connector for establishing electrical connection with an external unit, a part of said connector being exposed to the outside of said package body; said ultraviolet shield member has a handle for mounting and removing said ultraviolet shield member; and said card package body has an opening on a side surface thereof through which said connector is partially exposed, and a slit formed on another side surface of said card package body through which said ultraviolet shield member is freely inserted into and drawn out of said space, said handle being adopted to close said slit so as to prevent entrance of ultraviolet through said slit.

4. A ROM card unit comprising:
a ROM card board on which a plurality of ROMs allowing data stored therein to be erased by ultraviolet light radiation are mounted, said ROMs having ultraviolet radiation windows;
a card package body accommodating said ROM card board with said ROMs so as to expose those sides of said ROMs where said ultraviolet radiation windows are located, said card package body being formed of a material capable of cutting off ultraviolet light; and
ultraviolet transmission means mounted on that side of said card package body where there are said ultraviolet radiation windows of said ROMs, said ultraviolet transmission means normally cutting off ultraviolet light from the outside of said package body, whereas allowing the transmission of ultraviolet light when data stored in said ROMs is to be erased so that ultraviolet light is radiated from the outside of said package body through said ultraviolet radiation windows of said ROMs wherein said ultraviolet transmission means comprises a pair of transparent cover plates fixed, in spaced parallel relationship with each other, to that side of said card package body where there are said ultraviolet radiation windows of said ROMs, and an ultraviolet shield member formed of a material capable of cutting off ultraviolet light and removably mounted on said card package body in such a manner there said ultraviolet shield member can be freely mounted on and removed from said card package body by inserting said ultraviolet shield member into and drawing it out of the space between said transparent cover plates.

* * * * *